United States Patent

Cornelio et al.

Patent Number: 5,859,597
Date of Patent: Jan. 12, 1999

[54] HELICOPTER ELECTRONIC SYSTEM FOR DETECTING ELECTRIC POWER LINES DURING LANDING

[76] Inventors: C. Joseph Cornelio, 100 Executive Sq. Apt. 1006, Wethersfield, Conn. 06109; Kenneth Nevin Crocker, 34 Galpin St., Naugatuck, Conn. 06770

[21] Appl. No.: 964,621

[22] Filed: Nov. 5, 1997

[51] Int. Cl.$^6$ .................................................. G08B 21/00
[52] U.S. Cl. ......................... 340/946; 340/963; 340/903; 701/301; 324/207.2; 342/455; 342/458; 342/465
[58] Field of Search ..................................... 340/963, 946, 340/961, 903, 945, 979; 701/301; 324/251, 207.2; 342/455, 458, 417, 465; 73/178 R

[56] References Cited

U.S. PATENT DOCUMENTS

| | | | |
|---|---|---|---|
| 4,405,926 | 9/1983 | Potter | 343/455 |
| 5,252,912 | 10/1993 | Merritt et al. | 324/72 |
| 5,448,233 | 9/1995 | Saban et al. | 340/963 |
| 5,473,244 | 12/1995 | Libove et al. | 324/126 |

*Primary Examiner*—Benjamin C. Lee
*Attorney, Agent, or Firm*—Alix, Yale & Ristas, LLP

[57] ABSTRACT

The invention is an electronic system for warning helicopter pilots of the presence of electric power lines during landing. The system detects electromagnetic fields created by electricity flowing through the power lines. When the helicopter is closer than a predetermined distance from the power line, visual and audio alarms alert the pilot of the danger. When the helicopter is a safe distance from the power line, the alarms reset.

14 Claims, 2 Drawing Sheets

HELICOPTER ELECTRONIC SYSTEM FOR DETECTING ELECTRIC POWER LINES DURING LANDING

FIELD OF INVENTION

The invention relates to aircraft instrumentation and warning systems and in particular to helicopter instrumentation and warning systems. The invention also relates to electromagnetic field measurement systems as modified for helicopter use.

BACKGROUND OF THE INVENTION

The invention relates to the timely detection of electromagnetic fields created by alternating current flowing through electric power lines and notification of the helicopter pilot of their presence prior to landing.

Helicopters have the highest accident rate per 100,000 hours of operation of all commercial aircraft operated in the US. Most helicopter crashes occur during landing, often in inclement weather. Improvements such as lower cost radar, (Honeywell), are being introduced. The detection of power lines, which are not detectable by radar, in order to reduce the number of helicopter accidents, is the focus of this patent application.

PRIOR ART STATEMENT

The prior art includes a Collision Avoidance Radar Detection System, U.S. Pat. No. 5,111,210 by Morse which is a microwave signal detector system. A Reference Frequency and Low Voltage Detection Circuit by Tinsley, U.S. Pat. No. 4,568,877 is a digital frequency detection system using a microcomputer as a frequency counter. An Accurate Analog Measurement System by McKee, U.S. Pat. No. 4,884,019 measures the distortion on a known output signal and uses it to remove the distortion from the measurement signal. The 60 cycle signal emitted from the power lines is of sufficient strength that techniques such as McKee's will not be needed.

SUMMARY OF THE INVENTION

The helicopter power line detection system consists of an electronic system comprising:
   four Hall effect electromagnetic sensors strategically positioned for improved detection of power lines in four directions:
      electronic circuits for each of the four sensors for improved identification of 60 cycle electromagnetic fields;
      a reference voltage for representing a predetermined distance from the power line;
      a reference voltage for representing a safe distance from the power line;
      a band pass filter for improved detection of the 60 cycle ac signal generated by power lines;
      an amplifier circuit for converting the 60 cycle ac signal to a voltage level;
      a comparator circuit for comparing the voltage level from the converted 60 cycle signal with the reference voltage that represents the predetermined dangerous distance;
      a comparator circuit for comparing the voltage level from the converted 60 cycle signal with the reference voltage that represents the safe distance from the power line;
      a pilot display showing the direction of the power line below the helicopter for improved collision avoidance; and
      an audio pilot alert for improved pilot awareness resulting in improved collision avoidance.

OBJECTS OF THE INVENTION

It is an object of the present invention to provide a new and improved power line detection system.

It is another object of the present invention to provide a new and improved electromagnetic field detection system.

It is another object of the present invention to provide a power line detection system that can function in a helicopter environment.

It is another object of the present invention to provide an improved electronic filter for detecting 60 cycle ac signals.

It is another object of the present invention to provide a new and improved visual display indicating the direction of the power lines below the helicopter.

It is another object of the present invention to provide a new and improved audio alarm having unique audio characteristics for alerting the helicopter pilot of power lines.

BRIEF DESCRIPTION OF THE DRAWINGS

The objects, features and advantages of the invention may be understood with reference to the following detailed description of an illustrated embodiment of the invention, taken together with the accompanying drawings in which.

DETAILED DESCRIPTION

The sensors are located on the underside of the helicopter body. They are placed near the front of the helicopter to allow for forward motion during landing. Mechanical details of the sensor mounting will be determined and approved by helicopter manufacturers.

Four sensors are used. One is placed in line with the body of the helicopter. The second sensor is placed perpendicular to the first sensor, across the body of the helicopter. None of the sensors protrude out from the body of the helicopter so aerodynamics are minimally effected. The third sensor is placed at 45 degrees between the first and second sensors. The fourth sensor is placed 90 degrees from the third sensor. This placement gives maximum signal strength every 45 degrees. If the helicopter body does not interfere with or block EMF, the sensors may be placed inside the helicopter.

Figure 1A:
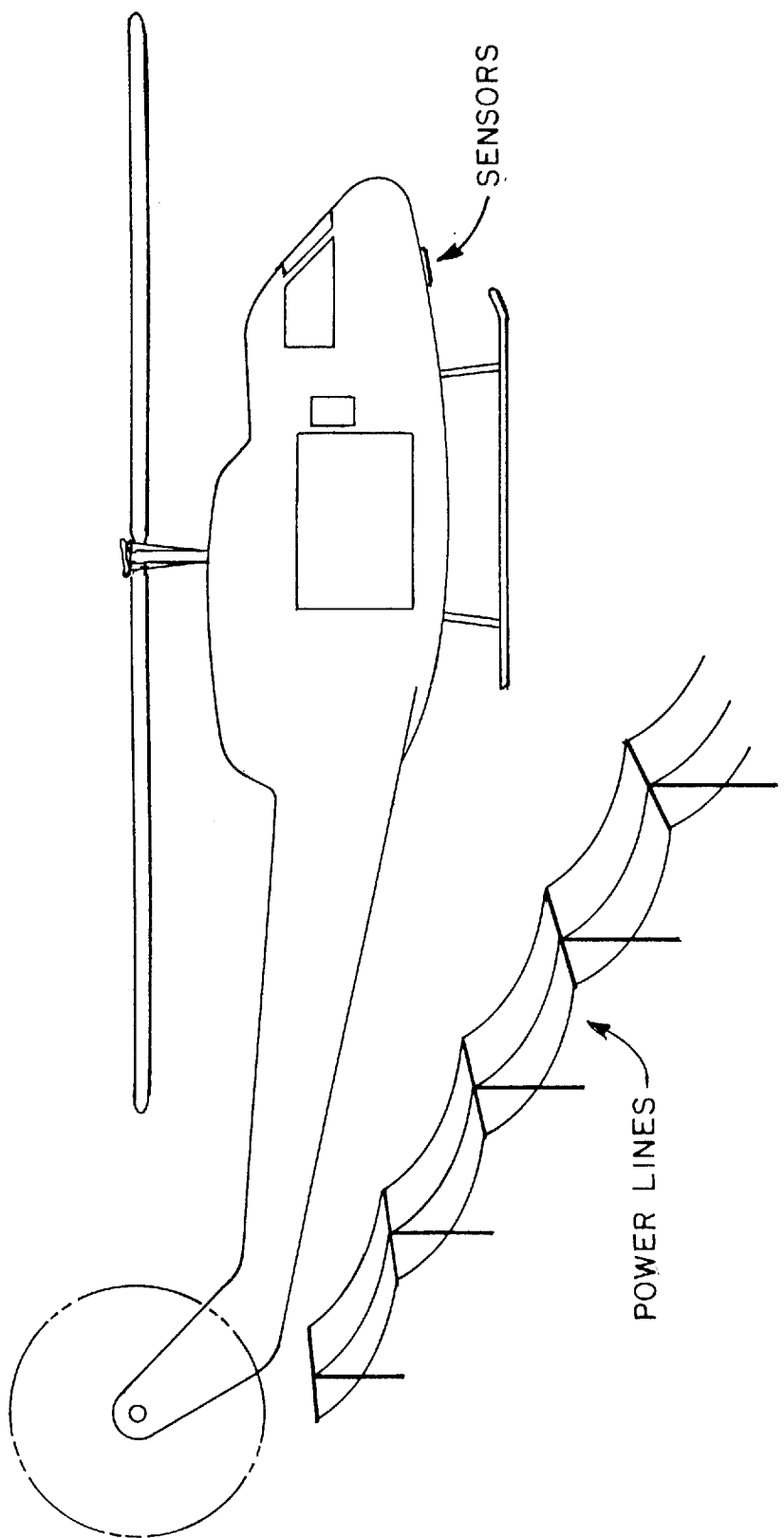
FIG. 1A is a side elevation view of a helicopter with the Hall effect electromagnetic sensors mounted underneath. The electromagnetic field detection pattern is illustrated.
Figure 2:
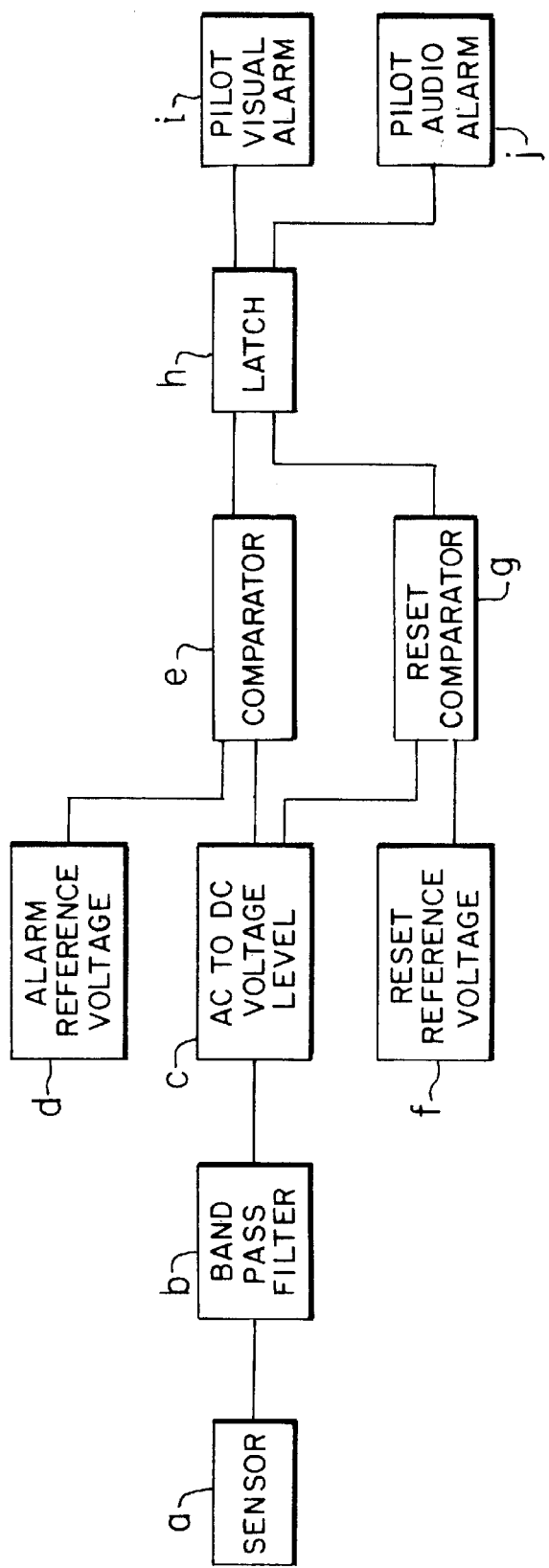
FIG. 2 is a block diagram of the electronic circuit for each Hall effect sensor. Two reference voltages and the audio alarm are for all four sensors.
Figure 3:
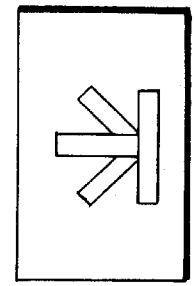
FIG. 3 is a front view of the visual alarm located on the display panel of the helicopter.
Figure 1B:
FIG. 1B shows the underside view of the electromagnetic sensors of a helicopter. The sensors are shown to illustrate their EMF detection pattern. The physical size of the sensors is not shown to scale.

FIG. 2 describes the electronic circuits needed to identify the EMF signal generated by a power line, compare it with a reference voltage to determine that a powerline is present, and alert the pilot. When the helicopter is no longer near the power line the alarms are reset.

The four directional sensors are housed in a plastic or fiberglass weatherproof housing under the body of the helicopter. Electrically shielded cables bring electric power to the sensors and convey the alternating current electromagnetic field back through shielded cable to the band pass filter b. A preamp circuit may be needed based on the distance from the power lines where the EMF is to be detected. The band pass filter b receives the 60 cycle signal and both helicopter and random noise. The output from the band pass filter is predominantly 60 cycle and is converted to a DC voltage level by circuit c. The DC voltage level c is compared with alarm reference voltage d by comparator e. Field testing needs to be done before the exact value of alarm reference voltage d can be set.

The reset reference voltage f. and the reset comparator g. are similar in design to reference voltage d. and comparator e. Comparator e. and reset comparator g. compare the DC amplitude c with their respective reference voltages and each outputs a dc level to the electronic latch circuit h. When the dc output level of comparator e is high, latch h locks high and the appropriate Pilot Visual Alarm j is activated by a display driver. If desired, a separate reference voltage can activate the audio alarm j. when the helicopter is closer to the power lines. A high level dc signal on the output of electronic latch h can be used to drive audio alarm j.

What is claimed is:

1. A power line detection system forewarning aircraft pilots of close proximity to power lines, comprising:

a plurality of Hall effect sensors attached to the aircraft for detecting an electromagnetic field emanating from an electric power line;

means for providing an alarm reference voltage level representing a hazardous distance from the electric power line;

means for providing a reset reference voltage level representing a safe distance from the electric power line;

a first electronic circuit for producing an electromagnetic signal which is related to the electromagnetic field detected by the Hall effect sensors, for comparing the electromagnetic signal to the alarm reference voltage level, and for activating the visual alarm if a first predetermined condition is met;

a second electronic circuit for comparing the electromagnetic signal to the reset reference voltage level and for deactivating the visual alarm if a second predetermined condition is met; and wherein the visual alarm comprises indication for each direction represented by the Hall effect sensors;

an audio alarm for indicating that power lines are below.

2. A power line detection system as in claim 1, wherein:

the first electronic circuit includes at least one bandpass filter to detect and isolate the ac signal generated by electricity passing through the power line.

3. A power line detection system as in claim 1, wherein:

the alarm reference voltage level is set based on the strength of the electromagnetic field a known distance from the power line.

4. A power line detection system as in claim 1, wherein:

the reset reference voltage level is set based on the signal strength of the electromagnetic field a predetermined safe distance away from the power line.

5. A power line detection system as in claim 1, wherein:

the first electronic circuit includes at least one band pass filter and at least one amplifier circuit for converting the ac signals from the band pass filters to DC voltage levels.

6. A power line detection system as in claim 1, wherein:

the first electronic circuit includes a comparator for comparing the signal voltage level with the alarm reference voltage level and for setting an electronic latch if the signal voltage level is greater than the alarm reference voltage level.

7. A power line detection system as in claim 1, wherein:

the second electronic circuit includes a reset comparator for comparing the signal voltage level with the reset reference voltage level and for resetting an electronic latch if the signal voltage level is less than the reset reference voltage level.

8. A power line detection system as in claim 1, wherein:

the visual alarm includes a visual display showing the direction of the power line when an electronic latch indicates that the power line is near.

9. A power line detection system as in claim 1, further comprising:

means for producing an audio alarm signal when an electronic latch indicates that the power line is near.

10. A power line detection system as in claim 1, wherein:

the Hall effect sensors are oriented at 45 degree angles outward from the center of a circle.

11. A power line detection system as in claim 10, wherein:

there are four Hall effect sensors.

12. A power line detection system for use in aviation comprising:

a plurality of Hall effect sensors for detecting an electromagnetic field emanating from the power line;

an electronic circuit for each of the sensors for determining the amplitude of the field, and for triggering an alarm when the amplitude of the field is greater than a first reference voltage;

an electronic circuit for each of the sensors for resetting the alarm when the amplitude of the field is less than a second reference voltage;

a visual display for indicating when the power line is near; and an audio alarm for indicating when the power line is near.

13. A power line detection system as in claim 12, wherein:

the Hall effect sensors are oriented at 45 degree angles outward from the center of a circle.

14. A power line detection system as in claim 12, wherein: there are four Hall effect sensors.

* * * * *